(12) United States Patent
Li et al.

(10) Patent No.: US 7,704,764 B2
(45) Date of Patent: Apr. 27, 2010

(54) FABRICATION METHOD OF GAN POWER LEDS WITH ELECTRODES FORMED BY COMPOSITE OPTICAL COATINGS

(75) Inventors: Jinmin Li, Beijing (CN); Xiaodong Wang, Beijing (CN); Guohong Wang, Beijing (CN); Liangchen Wang, Beijing (CN); Fuhua Yang, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 176 days.

(21) Appl. No.: 12/110,428

(22) Filed: Apr. 28, 2008

(65) Prior Publication Data

US 2009/0029495 A1 Jan. 29, 2009

(30) Foreign Application Priority Data

Jul. 25, 2007 (CN) .................. 2007 1 0119473

(51) Int. Cl.
*H01L 21/00* (2006.01)
(52) U.S. Cl. .................. 438/29; 438/604; 438/606; 438/609
(58) Field of Classification Search .......... 438/604, 438/606, 609, 29
See application file for complete search history.

(56) References Cited

U.S. PATENT DOCUMENTS 7,572,653 B2 * 8/2009 Kim et al. ............ 438/22

| | | | |
|---|---|---|---|
| 2002/0081800 A1 * | 6/2002 | Morita ............ | 438/237 |
| 2007/0023763 A1 * | 2/2007 | Takigawa et al. ...... | 257/79 |
| 2008/0042153 A1 * | 2/2008 | Beeson et al. ........ | 257/94 |

\* cited by examiner

*Primary Examiner*—Thanh V Pham
*Assistant Examiner*—Caleb Henry
(74) *Attorney, Agent, or Firm*—Hunton & Williams LLP

(57) ABSTRACT

Fabrication method of GaN power LED with electrodes formed by composite optical coatings, comprising epitaxially growing N—GaN, active, and P—GaN layers successively on a substrate; depositing a mask layer thereon; coating the mask layer with photoresist; etching the mask layer into an N—GaN electrode pattern; etching through that electrode pattern to form an N—GaN electrode region; removing the mask layer and cleaning; forming a transparent, electrically conductive film simultaneously on the P—GaN and N—GaN layers; forming P—GaN and N—GaN transparent, electrically conductive electrodes by lift-off; forming bonding pad pattern for the P—GaN and N—GaN electrodes by photolithography process; simultaneously forming thereon bonding pad regions for the P—GaN and N—GaN electrodes by stepped electron beam evaporation; forming an antireflection film pattern by photolithography process; forming an antireflection film; thinning and polishing the backside of the substrate, then forming a reflector thereon; and completing the process after scribing, packaging and testing.

6 Claims, 6 Drawing Sheets

FABRICATION METHOD OF GAN POWER LEDS WITH ELECTRODES FORMED BY COMPOSITE OPTICAL COATINGS

This application claims priority to Application No. 200710119473.3 filed Jul. 25, 2007 in China, which is incorporated herein by reference in its entirety.

BACKGROUND OF THE INVENTION

1. Field of the Invention

The present invention relates to fabrication technology of a semiconductor photoelectronic device, specifically to a fabrication method of GaN power LED with electrodes formed by composite optical coatings.

2. Description of Prior Art

Since white-light LEDs were invented, the application area of high-brightness LEDs has been extended to the market of high-efficiency light source. Compared with prior illumination light sources, the light source using LEDs has the benefits of energy conservation, long life period, small volume, high luminous efficiency, no pollution, having various colors and the like. The energy consumption of a white-light LED is only ⅛ of that of a filament lamp, and only ½ of a fluorescent lamp. The life period of the white-light LED can be up to one hundred thousands hours. Moreover, the white-light LEDs can be made mercury-free, which is very important in view of the demand for environmental protection and energy conservation. As the most commonly-used method of achieving the white-light LEDs, a blue-light chip of InGaN/GaN multi-quantum wells (MQW) is used to excite a yellow-light fluorescent powder (YAG: Ce3+). The semiconductor solid light source has a good prospect of being used as a green solid light source in a new-generation illumination revolution, due to a deep research on the blue-light material of the InGaN/GaN MQW and a steady improvement in the property of the manufactured white-light power LED devices.

Despite the great development in the research on GaN power LEDs, which rapidly increases the illumination efficiency, there is still a long way to achieve the object of completely replacing the conventional light sources. Current problems in quantum efficiency, current distribution uniformity and heat dissipation capacity of the device are technical bottleneck in a further improvement of the property of a LED. How to increase an extraction efficiency of the light emitted from a power GaN LED is one of the most important problems under research.

To solve the problem with respect to the extraction efficiency of the light emitted from a power GaN LED, those skilled in the art have proposed many solutions with respect to device configurations, fabrication processes, or the like, such as a flip-chip structure, a resonant cavity structure, a metal reflector, surface coarsing, using a photonic crystal, or the like, and have made much progress. Especially in a preparation of electrodes, a transparent electrode is often used for a P—GaN electrode. However, for the N—GaN electrode, a metal ohmic contact electrode is usually used, which certainly degrades the extraction efficiency of the LED because the metal has a high absorption coefficient for the light. The present invention proposes a novel design and a novel fabrication method of a GaN-based power LED with P and N electrodes formed by transparent composite optical coatings with high light extraction efficiency.

SUMMARY OF THE INVENTION

One object of the invention is to provide a fabrication method of GaN power LEDs with electrodes formed by composite optical coatings. In the inventive method, an ohmic contact electrode for N—GaN is also formed by the transparent composite optical coating. Since both the contact electrode for P—GaN and that for N—GaN are formed from a composite optical coating comprising a transparent and electrically conductive film and an optical antireflection film, the light loss between the GaN medium and the transmission medium (for example, the air) can be reduced. Consequently, the luminous efficiency is greatly improved.

To achieve the above object, the invention proposes the flowing solution: a fabrication method of GaN power LEDs with electrodes formed by composite optical coatings, is characterized by comprising the steps of:

a) epitaxially growing an N—GaN layer, an active layer, and a P—GaN layer successively on a substrate;

b) depositing a mask layer on the P—GaN layer by a PECVD process;

c) coating the mask layer with photoresist, and then etching the mask layer into an N—GaN electrode pattern by photolithography process and wet etching;

d) removing the remaining portion of the photoresist, and then forming an N—GaN electrode region by etching through the N—GaN electrode pattern by ICP dry etching;

e) removing the remaining portion of the mask layer by wet etching process, and then cleaning;

f) simultaneously forming a transparent and electrically conductive film on both the P—GaN layer and the N—GaN electrode region by photolithography process and electron beam evaporation, and then forming a P—GaN transparent and electrically conductive electrode and an N—GaN transparent and electrically conductive electrode by lift-off;

g) forming bonding pad patterns for the P—GaN electrode and the N—GaN electrode on the P—GaN transparent and electrically conductive electrode and the N—GaN transparent and electrically conductive electrode by photolithography process, and then simultaneously forming bonding pad regions for the P—GaN electrode and the N—GaN electrode on the bonding pad patterns for the P—GaN electrode and the N—GaN electrode by stepped electron beam evaporation;

h) performing alloying treatment on the bonding pad regions for the P—GaN electrode and the N—GaN electrode;

i) forming an antireflection film pattern by photolithography process;

j) forming an antireflection film through the antireflection film pattern of the device;

k) thinning and polishing the backside of the substrate, and then forming a reflector on it; and l) completing the process after scribing, packaging and testing.

Preferably, the bonding pad region for the P—GaN electrode and the N—GaN electrode are in a multilayer metal film structure.

Preferably, the multilayer metal film structure is Cr/Ag/Pt/Au.

Preferably, the transparent and electrically conductive film is made of the transparent and electrically conductive material selected from ITO or ZnO.

Preferably, the optical antireflection film is made of a dielectric material having a refractive index between that of the transparent and electrically conductive film and that of the packaging materials or the air.

Preferably, the material of the mask layer is $SiO_2$.

BENEFICIAL EFFECTS OF THE INVENTION

As known from the above solutions, the invention has the following beneficial effects.

With the configuration of the GaN power LED with P and N electrodes formed by a composite optical coating, i.e. the P and N electrodes both have the structure including a transparent and electrically conductive film and an optical antireflection film, the luminous efficiency is greatly improved because the light loss between the GaN medium and the transmission medium (for example, the air) can be reduced. Also, the process is simplified because the P and N electrodes are simultaneously formed. The antireflection film designed for the medium has a high density and insulating property, which prevents a leakage passage from being formed along a cross section of the active region. The antireflection film has the same function as a passivation film of the device, and thus avoids a separate step of forming a passivation film for a conventional device, which further simplifies the process. The bonding pad regions for the P and N electrodes are formed in a multilayer metal film structure, which reduces a light absorption by the bonding pads. To sum up, the inventive method of manufacturing a GaN power LED effectively reduces light absorption, increases an extraction efficiency of the light, simplifies the process, and reduces the cost.

BRIEF DESCRIPTION OF THE DRAWINGS

The specific technical content of the invention will be depicted with reference to the embodiments and attached drawings, in which.

DETAILED DESCRIPTION OF PREFERRED EMBODIMENTS

Figure 1:
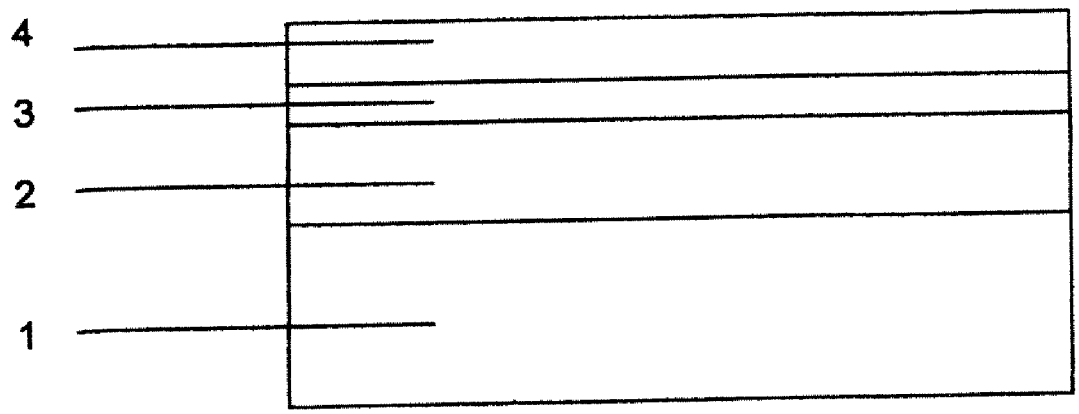
FIG. 1 is a schematic sectional view showing a structure of epitaxially-grown materials of the GaN power LED, comprising an N—GaN layer 2, an active layer 3 and a P—GaN layer 4 formed on a substrate 1 by epitaxial growth.
Figure 2:
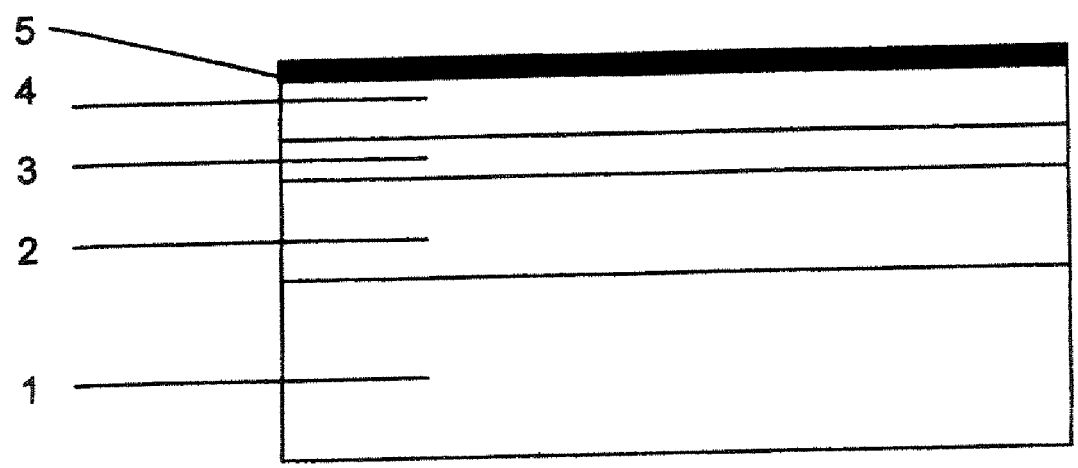
FIG. 2 is schematic diagram showing the structure after a SiO$_2$ mask layer 5 is deposited on the structure shown in FIG. 1 by PECVD.
Figure 3:
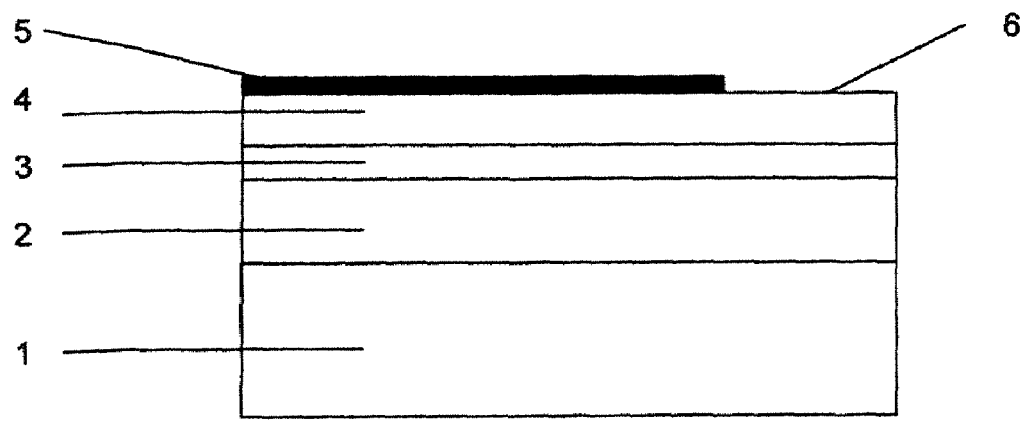
FIG. 3 is a schematic diagram showing the structure after the structure obtained in FIG. 2 is coated with photoresist, and then the SiO$_2$ mask layer 5 is etched into an N—GaN electrode pattern 6 having a long ridge stripe shape.
Figure 4:
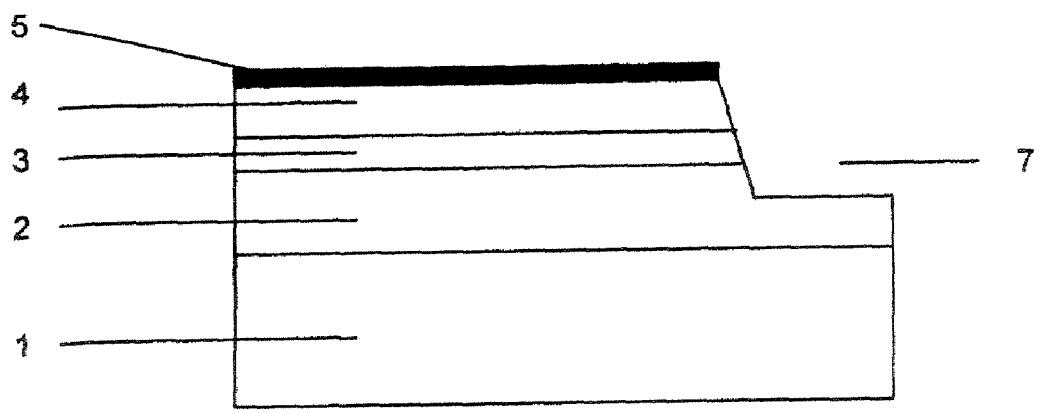
FIG. 4 is a schematic diagram showing the structure after an N—GaN electrode region 7 is formed by ICP dry etching through the N—GaN electrode pattern 6.
Figure 5:
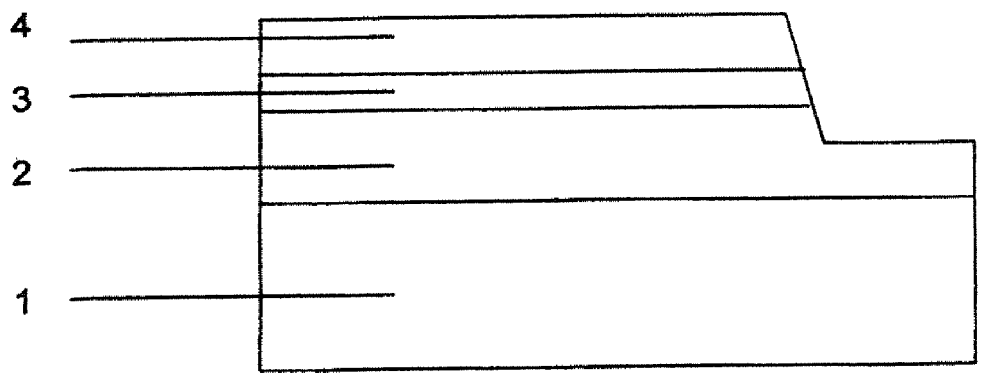
FIG. 5 is a schematic diagram showing the structure after the remaining portion of the SiO$_2$ mask layer 5 is removed by wet etching, and then cleaned.
Figure 6:
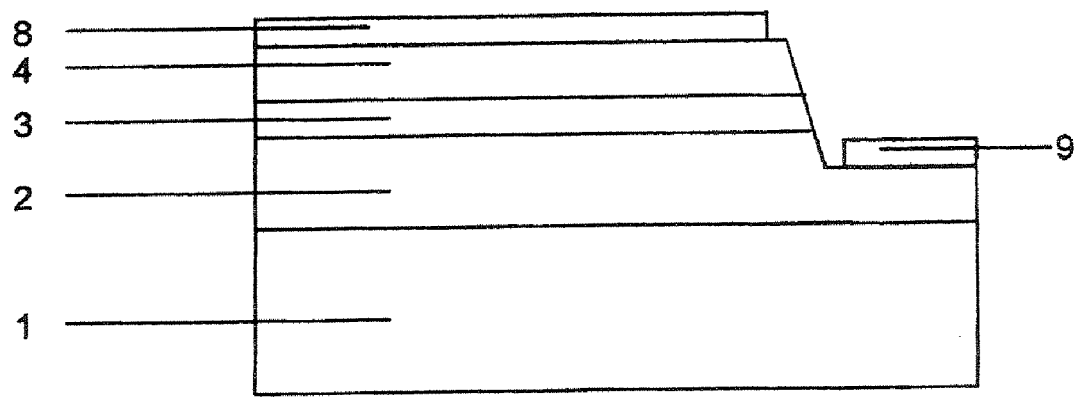
FIG. 6 is a schematic diagram showing the structure after a P—GaN transparent and electrically conductive electrode 8 and an N—GaN transparent and electrically conductive electrode 9 is formed by simultaneously forming a transparent and electrically conductive film on the P—GaN layer 4 and the N—GaN electrode region 7 by photolithography process and electron beam evaporation and then lift-off.
Figure 7:
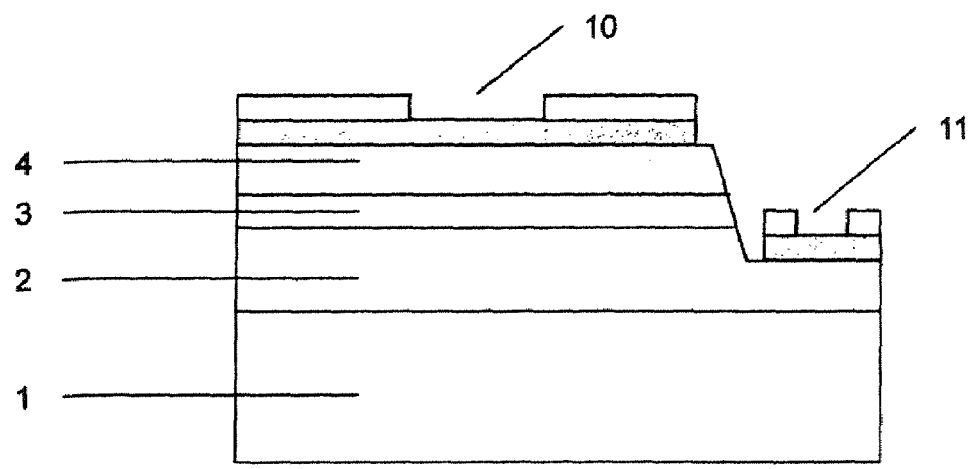
FIG. 7 is a schematic diagram showing the structure after a bonding pad pattern 10 for the P—GaN electrode and a bonding pad pattern 11 for the N—GaN electrode are formed respectively on the P—GaN transparent and electrically conductive electrode 8 and the N—GaN transparent and electrically conductive electrode 9 shown in FIG. 6, by photolithography process.
Figure 9:
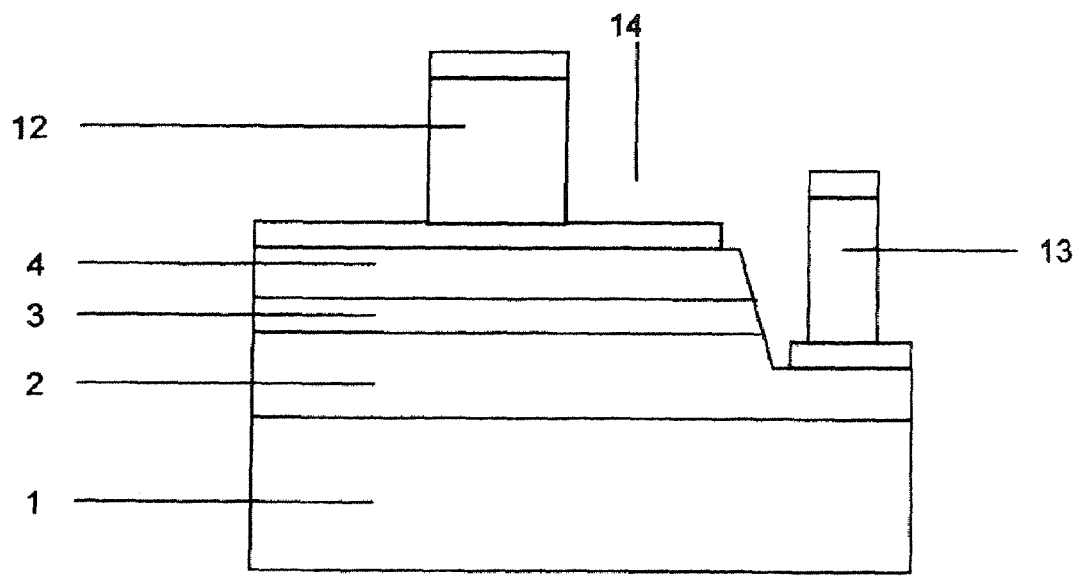
FIG. 9 is a schematic diagram showing the structure after an antireflection film pattern 14 is formed on the structure shown in FIG. 8, by photolithography process.

The invention will be depicted with reference to FIGS. 1-10, which illustrates a fabrication method of GaN power LED with electrodes formed by composite optical coatings, characterized by comprising the steps of:

a) epitaxially growing an N—GaN layer 2, an active layer 3, a P—GaN layer 4 successively on a substrate 1 (see FIG. 1);

b) depositing a mask layer 5 of SiO$_2$ on the P—GaN layer 4 by a PECVD process (see FIG. 2);

c) coating the mask layer 5 with photoresist, and then etching the mask layer 5 into an N—GaN electrode pattern 6 by photolithography process and wet etching (see FIG. 3);

d) removing the remaining portion of the photoresist, and then forming an N—GaN electrode region 7 by etching through the N—GaN electrode pattern 6 by ICP dry etching (see FIG. 4);

e) removing the remaining portion of the mask layer 5 by wet etching process, and then cleaning (see FIG. 5);

f) simultaneously forming a transparent and electrically conductive film, which is made of the transparent and electrically conductive material selected from ITO or ZnO, on both the P—GaN layer 4 and the N—GaN electrode region 7 by photolithography process and electron beam evaporation, and then forming a P—GaN transparent and electrically conductive electrode 8 and an N—GaN transparent and electrically conductive electrode 9 by lift-off (see FIG. 6);

g) forming a bonding pad pattern 10 for the P—GaN electrode and a bonding pad pattern 11 for the N—GaN electrode on the P—GaN transparent and electrically conductive electrode 8 and the N—GaN transparent and electrically conductive electrode 9 by photolithography process (see FIG. 7), and then simultaneously forming a bonding pad region 12 for the P—GaN electrode and a bonding pad region 13 for the N—GaN electrode on the bonding pad pattern 10 for the P—GaN electrode and the bonding pad pattern 11 for the N—GaN electrode, by stepped electron beam evaporation (see FIG. 8), in which the bonding pad region 12 for the P—GaN electrode and the bonding pad region 13 for the N—GaN electrode are in a multilayer metal film structure of Cr/Ag/Pt/Au;

h) performing alloying treatment on the bonding pad region 12 for the P—GaN electrode and the bonding pad region 13 for the N—GaN electrode;

i) forming an antireflection film pattern 14 by photolithography process (see FIG. 9);

j) forming an antireflection film 15 through the antireflection film pattern 14 of the device (see FIG. 10), in which the optical antireflection film 15 is made of a dielectric material having a reflective index between the reflective index of the transparent and electrically conductive film and that of the air;

k) thinning and polishing backside of the substrate 1, and then forming a reflector on it (see FIG. 11); and l) completing the process after scribing, packaging and testing (see FIG. 12).

The invention will be depicted in detail with reference to the embodiment and attached drawings so that objects, solutions, and the advantages of the invention are best understood.

Figure 11:
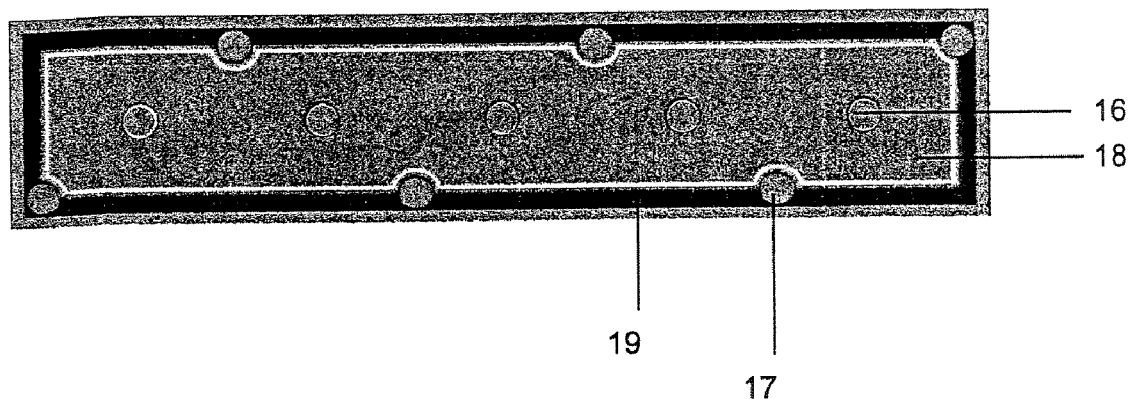
FIG. 11 is a top view showing the inventive P and N—GaN electrode structure of a long stripe structure, in which reference number 16 designates the bonding pad region for the P—GaN electrode, 17 designates the bonding pad region for the N—GaN electrode, 18 designates the P—GaN electrode region, and 19 designates the N—GaN electrode region.

The invention can be applied to various LED structures such as a flip chip structure, a vertical structure, or the like. In this embodiment, a long stripe structure is given in FIG. 11 as a preferable design. In FIG. 11, reference number 16 designates a bonding pad region for the P—GaN electrode to be described, 17 designates a bonding pad region for the N—GaN electrode to be described, 18 designates a P—GaN electrode region to be described, and 19 designates an N—GaN electrode region to be described. The structure shown in FIG. 11 takes electrical and thermal properties of the device into consideration. Both the simulation and experimental results reveal that the structure has a good electrical property and a good heat dissipation property.

Figure 8:
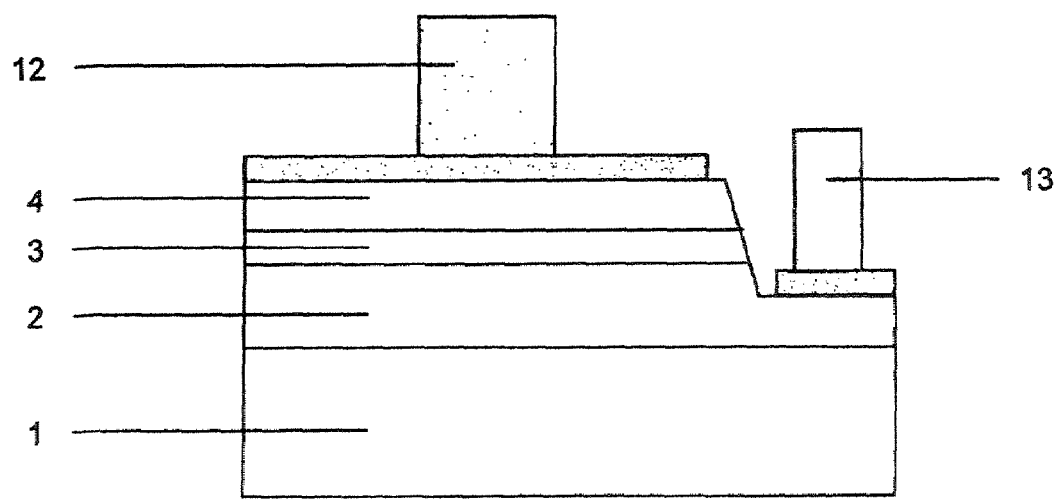
FIG. 8 is a schematic diagram showing the structure after a metallic boding pattern region 12 for the P—GaN electrode and a bonding pad region 13 for the N—GaN electrode are formed respectively on the bonding pad pattern 10 for the P—GaN electrode and the bonding pad region 11 for the N—GaN electrode shown in FIG. 7, by stepped electron beam evaporation.
Figure 10:
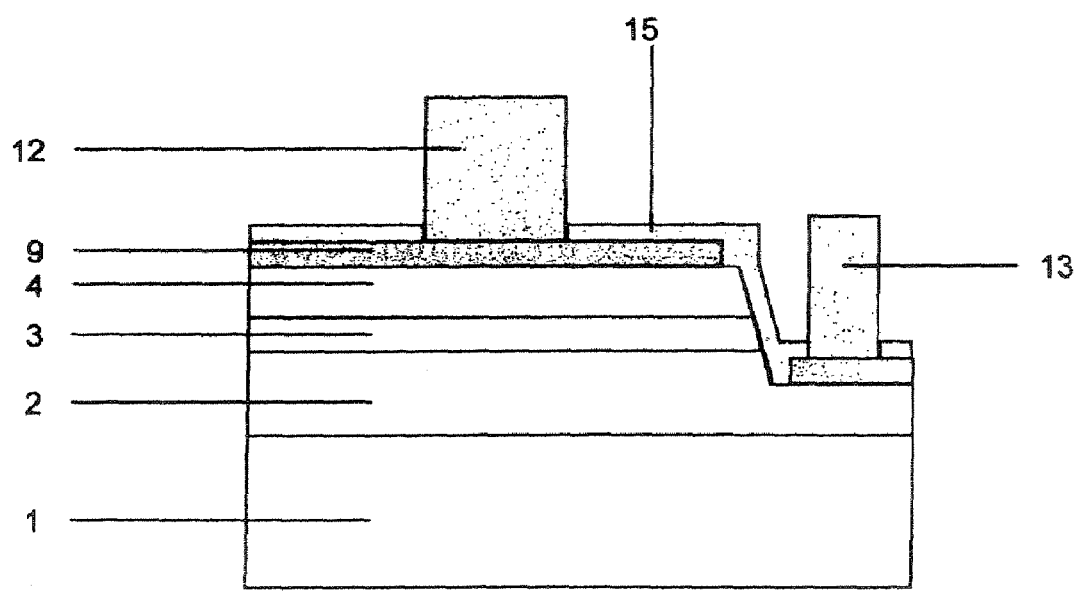
FIG. 10 is a schematic diagram showing the structure after an antireflection film 15 is formed through the antireflection film pattern 14 shown in FIG. 9.

In this embodiment, the fabrication method of GaN power LED with electrodes formed by composite optical coatings comprises the steps of:

a) epitaxially growing an N—GaN layer 2, an active layer 3, a P—GaN layer 4 successively on a sapphire substrate 1, as shown in FIG. 1, in which the substrate can also be made of silicon carbide (SiC) or other materials;

b) depositing a mask layer 5 of $SiO_2$ on the P—GaN layer 4 by PECVD, as shown in FIG. 2, in which the PECVD process for depositing the mask layer 5 of $SiO_2$ is performed at a temperature of 300° C., with a flow rate ratio of working gases of $N_2:SiH_4:N_2O=4:1.5:15$, a pressure less than 1.5 torr in the chamber, a RF power less than 50 W, which are determined by considering the process requirement (the process thus has the benefits of alleviating RF damage to the LED lighting materials and obtains $SiO_2$ having a good density and a high insulation strength);

c) coating the mask layer 5 of $SiO_2$ with photoresist according to an electrode structure arranged in a long stripe structure, and then etching the mask layer 5 of $SiO_2$ into an N—GaN electrode pattern 6 by photolithography process and wet etching, as shown in FIG. 3;

d) removing the remaining portion of the photoresist, and then forming an N—GaN electrode region 7 by etching through the N—GaN electrode pattern 6 by ICP dry etching, as shown in FIG. 4, in which the ICP dry etching with low damage effects is used and results in a favorable step structure, while greatly alleviating damages caused by the etching;

e) removing the remaining portion of the mask layer 5 of $SiO_2$ by wet etching process with an etching solution used for $SiO_2$, and then cleaning, and the resultant structure of a GaN based LED is shown in FIG. 5;

f) simultaneously forming the transparent and electrically conductive film of ITO, on both the P—GaN layer 4 and the N—GaN electrode region 7 by photolithography process and electron beam evaporation, and then forming a P—GaN transparent and electrically conductive electrode 8 and an N—GaN transparent and electrically conductive electrode 9 by lift-off, as shown in FIG. 6, in which other transparent and electrically conductive materials such as ZnO can also be used for the transparent and electrically conductive film, and the step is characterized by that the P—GaN transparent and electrically conductive electrode 8 and the N—GaN transparent and electrically conductive electrode 9 can be formed simultaneously since the same materials are used, and compared with a conventional process in which a P—GaN transparent and electrically conductive electrode and an N—GaN transparent and electrically conductive electrode are formed in different steps, the process is greatly simplified since the photolithography step and the evaporation step can be performed simultaneously;

g) forming a bonding pad pattern 10 for the P—GaN electrode and a bonding pad pattern 11 for the N—GaN electrode respectively on the P—GaN transparent and electrically conductive electrode 8 and the N—GaN transparent and electrically conductive electrode 9 by photolithography process, and then simultaneously forming a bonding pad region 12 for the P—GaN electrode and a bonding pad region 13 for the N—GaN electrode on the bonding pad pattern 10 for the P—GaN electrode and the bonding pad pattern 11 for the N—GaN electrode, by stepped electron beam evaporation, as shown in FIG. 8, in which the bonding pad region 12 for the P—GaN electrode and the bonding pad region 13 for the N—GaN electrode are formed in a multilayer metal film structure of Cr/Ag/Pt/Au, which reduces a light absorption of the electrode and improves a light extraction efficiency of the GaN-based power LED, and the multilayer metal film can also be formed in other structures, for example Ni/Ag/Pt/Au;

h) performing alloying treatment on the bonding pad region 12 for the P—GaN electrode and the bonding pad region 13 for the N—GaN electrode, so as to obtain a favorable contact resistance between the metallic electrode and the ITO layer, and to increase an adhesion force at the boundary;

i) forming an antireflection film pattern 14 by photolithography process, as shown in FIG. 9, which covers the region other than the bonding pad region 12 for the P—GaN electrode and the bonding pad region 13 for the N—GaN electrode;

j) forming an antireflection film 15 through the antireflection film pattern 14 of the device, as shown in FIG. 10; in this embodiment, an $Al_2O_3$ antireflection film is formed by ion beam sputtering to have a thickness corresponding to a wavelength of the light emitted from the LED, which can also prevent a leakage passage from being formed along a cross section of the exposed active region and function as a passivation film of the device, because the $Al_2O_3$ antireflection film is a dielectric film and can be formed with high density and insulating property by ion beam sputtering; as a result, a separate step of forming a passivation film in a conventional manufacturing method of LED can be avoided, which simplifies the process; the optical antireflection film can be formed by electron beam evaporation, or formed with other dielectric materials having a refractive index between that of the transparent and electrically conductive film and that of the package material or the air;

k) thinning and polishing the backside of the sapphire substrate 1, and then forming a reflector on it; in this embodiment, a $SiO_2/Ta_2O_5$ high-reflection dielectric film having a reflective index of at least 99% is formed by ion beam sputtering; the reflector can also be those commonly-used metal reflector such as Ag; however, the reflector with a dielectric film used therein can provide a higher refractivity, and further increases the light extraction efficiency of the LED; and l) completing the process after scribing, packaging and testing.

While objects, technical solutions, and beneficial effects of the invention are explained with reference to various embodiments in the above text, it should be understood that these embodiments are presented by way of example only, but not limitation. Any modifications, equivalent replacements and improvements in accordance with the sprit and principle of the invention should be construed as being encompassed by the protection scope of the invention.

What is claimed is:

1. A fabrication method of GaN power LED with electrodes formed by composite optical coatings, characterized by comprising the steps of:
    a) epitaxially growing an N—GaN layer, an active layer, a P—GaN layer successively on a substrate;
    b) depositing a mask layer on the P—GaN layer by a PECVD process;
    c) coating the mask layer with photoresist, and then etching the mask layer into an N—GaN electrode pattern by photolithography process and wet etching;
    d) removing the remaining portion of the photoresist, and then forming an N—GaN electrode region by etching through the N—GaN electrode pattern by ICP dry etching;
    e) removing the remaining portion of the mask layer by wet etching process, and then cleaning;
    f) simultaneously forming a transparent and electrically conductive film on both the P—GaN layer and the N—GaN electrode region by photolithography process and electron beam evaporation, and then forming a P—GaN transparent and electrically conductive electrode and an N—GaN transparent and electrically conductive electrode by lift-off;
    g) forming bonding pad patterns for a P—GaN electrode and an N—GaN electrode on the P—GaN transparent and electrically conductive electrode and the N—GaN transparent and electrically conductive electrode by photolithography process, and then simultaneously forming bonding pad regions for the P—GaN electrode and the N—GaN electrode on the bonding pad patterns for the P—GaN electrode and the N—GaN electrode by stepped electron beam evaporation;
    h) performing alloying treatment on the bonding pad regions for the P—GaN electrode and the N—GaN electrode;
    i) forming an antireflection film pattern by photolithography process;
    j) forming an antireflection film through the antireflection film pattern of the device;
    k) thinning and polishing the backside of the substrate, and then forming a reflector on it;
    l) completing the process after scribing, packaging and testing.

2. The fabrication method of GaN power LED with electrodes formed by composite optical coatings according to claim 1, wherein the bonding pad regions for the P—GaN electrode and the N—GaN electrode are in a multilayer metal film structure.

3. The fabrication method of GaN power LED with electrodes formed by composite optical coatings according to claim 2, wherein the multilayer metal film structure is Cr/Ag/Pt/Au.

4. The fabrication method of GaN power LED with electrodes formed by composite optical coatings according to claim 1, wherein the transparent and electrically conductive film is made of the transparent and electrically conductive material selected from ITO or ZnO.

5. The fabrication method of GaN power LED with electrodes formed by composite optical coatings according to claim 1, wherein the optical antireflection film is made of a dielectric material having a refractive index between that of the transparent and electrically conductive film and that of the packaging materials or the air.

6. The fabrication method of GaN power LED with electrodes formed by composite optical coatings according to claim 1, wherein the material of the mask layer is $SiO_2$.

* * * * *